(12) United States Patent
Hwang

(10) Patent No.: US 10,347,584 B1
(45) Date of Patent: Jul. 9, 2019

(54) FAN-OUT SEMICONDUCTOR PACKAGE

(71) Applicant: SAMSUNG ELECTRO-MECHANICS CO., LTD., Suwon-si, Gyeonggi-do (KR)

(72) Inventor: Kyu Il Hwang, Suwon-si (KR)

(73) Assignee: SAMSUNG ELECTRO-MECHANICS CO., LTD., Suwon-si, Gyeonggi-Do (KR)

(*) Notice: Subject to any disclaimer, the term of this patent is extended or adjusted under 35 U.S.C. 154(b) by 0 days.

(21) Appl. No.: 16/000,625

(22) Filed: Jun. 5, 2018

(30) Foreign Application Priority Data

Dec. 28, 2017 (KR) ........................ 10-2017-0181753

(51) Int. Cl.
*H01L 23/498* (2006.01)
*H01L 23/538* (2006.01)
(Continued)

(52) U.S. Cl.
CPC ...... *H01L 23/5384* (2013.01); *H01L 23/5386* (2013.01); *H01L 23/53238* (2013.01);
(Continued)

(58) Field of Classification Search
CPC ......... H01L 23/53238; H01L 23/53252; H01L 23/53266; H01L 23/5384; H01L 23/5386;
(Continued)

(56) References Cited

U.S. PATENT DOCUMENTS 9,735,114 B1    8/2017  Xu et al.
2009/0102071 A1  4/2009  Kindo
(Continued)

FOREIGN PATENT DOCUMENTS

JP    2009-099840 A    5/2009
KR    10-2014-0117285 A    10/2014
(Continued)

OTHER PUBLICATIONS

Taiwanese Office Action dated Jan. 29, 2019 issued in Taiwanese Patent Application No. 107120008 (with English translation).
(Continued)

*Primary Examiner* — Cuong Q Nguyen
(74) *Attorney, Agent, or Firm* — Morgan Lewis & Bockius LLP

(57) ABSTRACT

A fan-out semiconductor package includes: a core member having a through-hole and having first fiducial marks disposed on an upper surface thereof in the vicinity of the through-hole; a semiconductor chip disposed in the through-hole and having an active surface having connection pads and second fiducial marks disposed thereon and an inactive surface opposing the active surface; an encapsulant encapsulating at least portions of the semiconductor chip; and a connection member disposed on the active surface of the semiconductor chip and including a redistribution layer electrically connected to the connection pads of the semiconductor chip, wherein the first fiducial marks are disposed to be symmetrical to each other with respect to a center of the through-hole on a plane view, and the second fiducial marks are disposed to be symmetrical to each other with respect to a center of the semiconductor chip on the plane view.

19 Claims, 17 Drawing Sheets

(51) Int. Cl.
  *H01L 23/00* (2006.01)
  *H01L 23/544* (2006.01)
  *H01L 23/532* (2006.01)

(52) U.S. Cl.
  CPC .. *H01L 23/53252* (2013.01); *H01L 23/53266* (2013.01); *H01L 23/544* (2013.01); *H01L 24/10* (2013.01)

(58) Field of Classification Search
  CPC ....... H01L 23/544; H01L 24/10; H01L 24/11; H01L 24/19; H01L 24/20
  See application file for complete search history.

(56) References Cited

U.S. PATENT DOCUMENTS

| | | |
|---|---|---|
| 2013/0250298 A1 | 9/2013 | Komuta et al. |
| 2014/0103527 A1 | 4/2014 | Marimuthu et al. |
| 2014/0284780 A1 | 9/2014 | Kinoshita |
| 2017/0040265 A1* | 2/2017 | Park ........................ H01L 24/19 |
| 2017/0062368 A1 | 3/2017 | Jung et al. |
| 2017/0125318 A1* | 5/2017 | Harr ........................ H01L 24/19 |
| 2017/0133293 A1 | 5/2017 | Oh et al. |
| 2017/0271272 A1* | 9/2017 | Lee ..................... H01L 23/5386 |
| 2017/0309571 A1 | 10/2017 | Yi et al. |
| 2018/0082933 A1* | 3/2018 | Ko ........................ H01L 24/19 |

FOREIGN PATENT DOCUMENTS

| | | |
|---|---|---|
| KR | 10-2014-0118137 A | 10/2014 |
| KR | 10-2017-0023531 A | 3/2017 |
| KR | 10-2017-0121671 A | 11/2017 |

OTHER PUBLICATIONS

Korean Office Action dated Mar. 19, 2019 issued in Korean Patent Application No. 10-2017-0181753 (with English translation).

\* cited by examiner

FAN-OUT SEMICONDUCTOR PACKAGE

CROSS-REFERENCE TO RELATED APPLICATION(S)

This application is based on and claims the benefit of priority to Korean Patent Application No. 10-2017-0181753 filed on Dec. 28, 2017 in the Korean Intellectual Property Office, the entire disclosure of which is incorporated herein by reference.

TECHNICAL FIELD

The present disclosure relates to a fan-out semiconductor package.

BACKGROUND

Semiconductor packages have been continuously required to be thinned and lightened, and have been required to be implemented in a system in package (SiP) form requiring complexity and multi-functionality in terms of a function.

One type of package technology suggested to satisfy the technical demand as described above is a fan-out semiconductor package. Such a fan-out semiconductor package has a compact size and may allow a plurality of pins to be implemented by redistributing connection terminals outwardly of a region in which a semiconductor chip is disposed.

Recently, a cavity process has been mainly used to manufacture a fan-out type package. The cavity process may be, for example, a process of forming a cavity in a copper clad laminate (CCL), or the like, disposing an electronic component in the cavity, encapsulating the electronic component with an encapsulant, and forming a redistribution layer (RDL). Meanwhile, in the cavity process, the electronic component is disposed in the cavity, and it is thus necessary to dispose the electronic component precisely, and alignment between the electronic component and the CCL has an influence on matching between the electronic component and the redistribution layer.

SUMMARY

An aspect of the present disclosure may provide a fan-out semiconductor package having improved reliability by having fiducial marks.

According to an aspect of the present disclosure, a fan-out semiconductor package may be provided, in which fiducial marks are formed on a core member and a semiconductor chip.

According to an aspect of the present disclosure, a fan-out semiconductor package may include: a core member having a through-hole and having first fiducial marks disposed on an upper surface thereof in the vicinity of the through-hole; a semiconductor chip disposed in the through-hole and having an active surface having connection pads and second fiducial marks disposed thereon and an inactive surface opposing the active surface; an encapsulant encapsulating at least portions of the semiconductor chip; and a connection member disposed on the active surface of the semiconductor chip and including a redistribution layer electrically connected to the connection pads of the semiconductor chip, wherein the first fiducial marks are disposed to be symmetrical to each other with respect to a center of the through-hole on a plane view of the fan-out semiconductor package perpendicular to a stacking direction, and the second fiducial marks are disposed to be symmetrical to each other with respect to a center of the semiconductor chip on the plane view.

According to another aspect of the present disclosure, a fan-out semiconductor package may include: a core member having a through-hole; a semiconductor chip disposed in the through-hole and having an active surface having connection pads disposed thereon and an inactive surface opposing the active surface; an encapsulant encapsulating at least portions of the semiconductor chip; and a connection member disposed on the active surface of the semiconductor chip and including a redistribution layer electrically connected to the connection pads of the semiconductor chip, wherein the core member has first fiducial marks disposed at a circumference of the through-hole, and the semiconductor chip has second fiducial marks disposed on the active surface.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
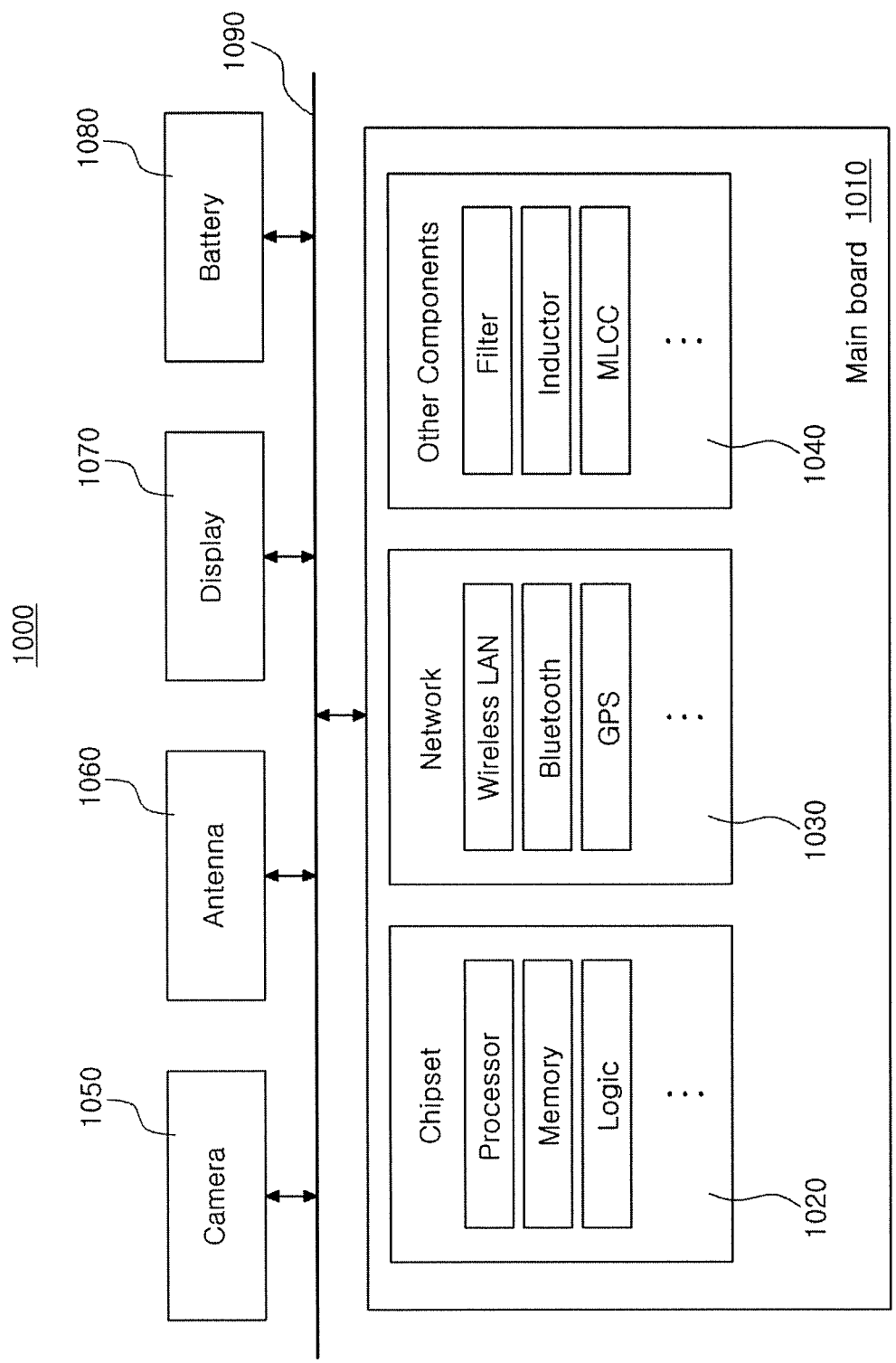
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
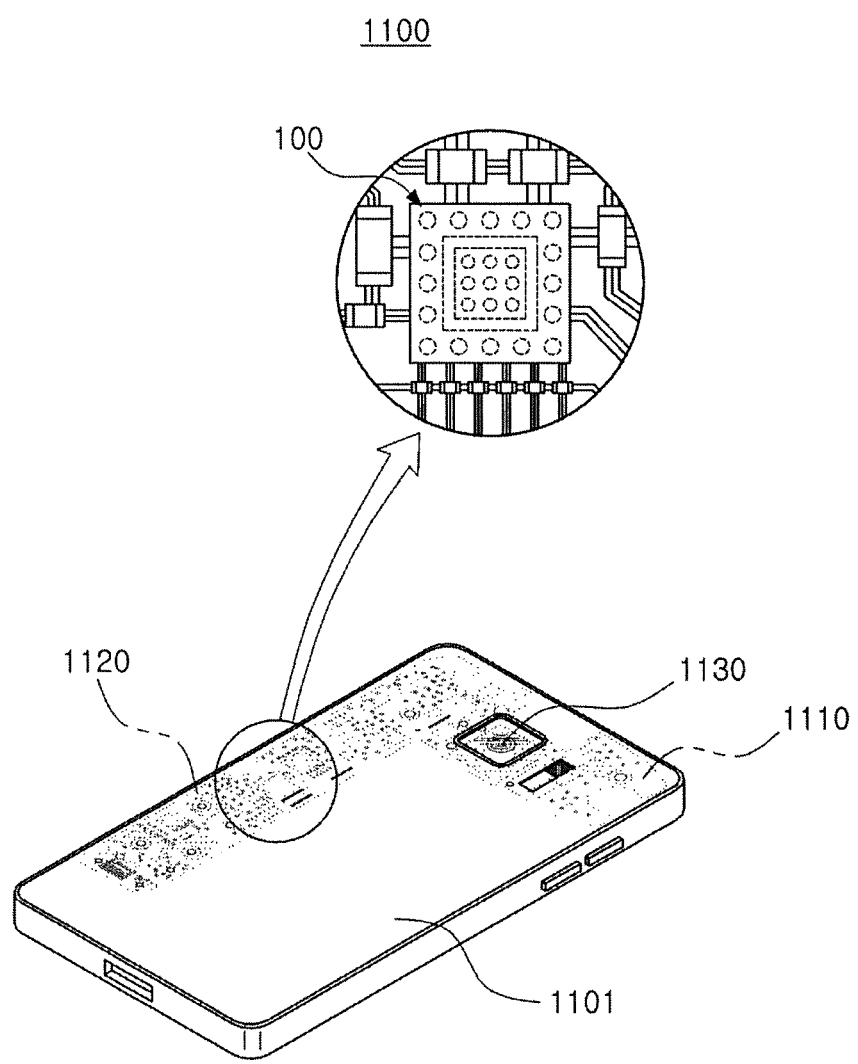
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
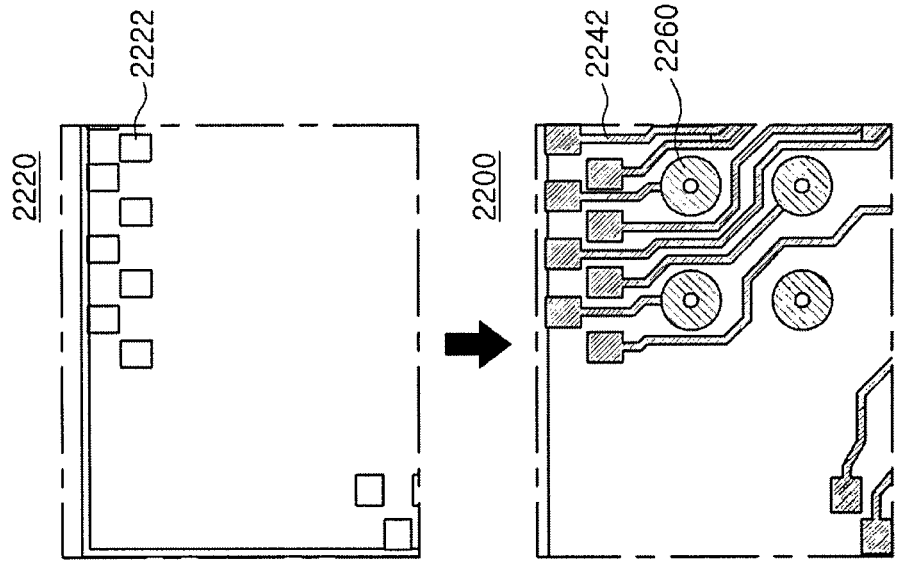
FIGS. 3A and 3B are schematic cross-sectional views illustrating states of a fan-in semiconductor package before and after being packaged.
Figure 3A:
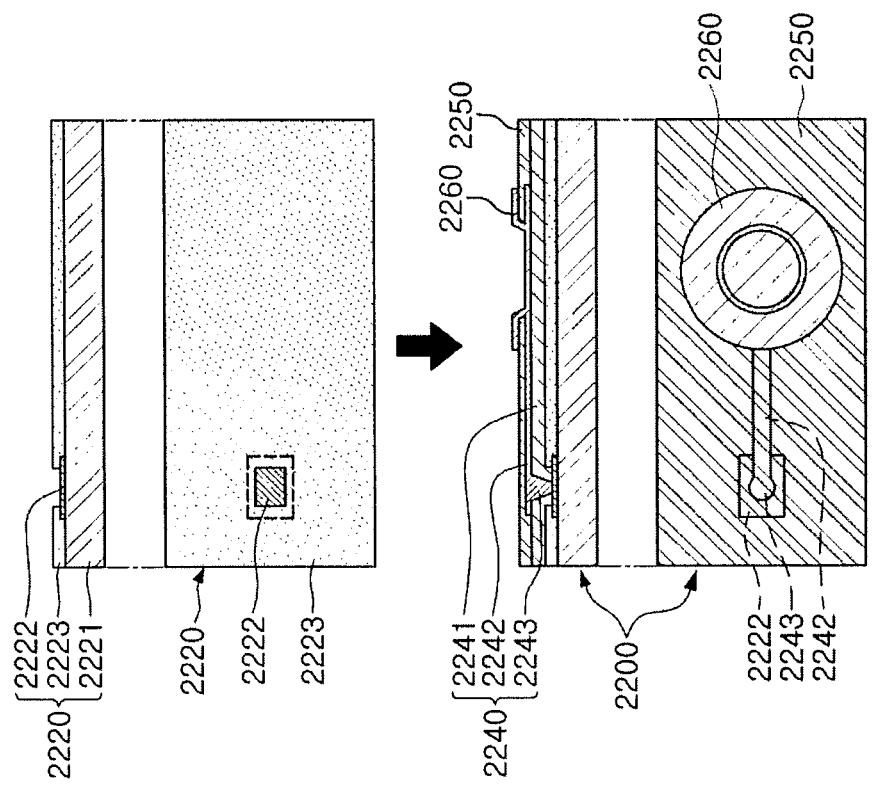

FIGS. 3A and 3B are schematic cross-sectional views illustrating states of a fan-in semiconductor package before and after being packaged.

Figure 4:
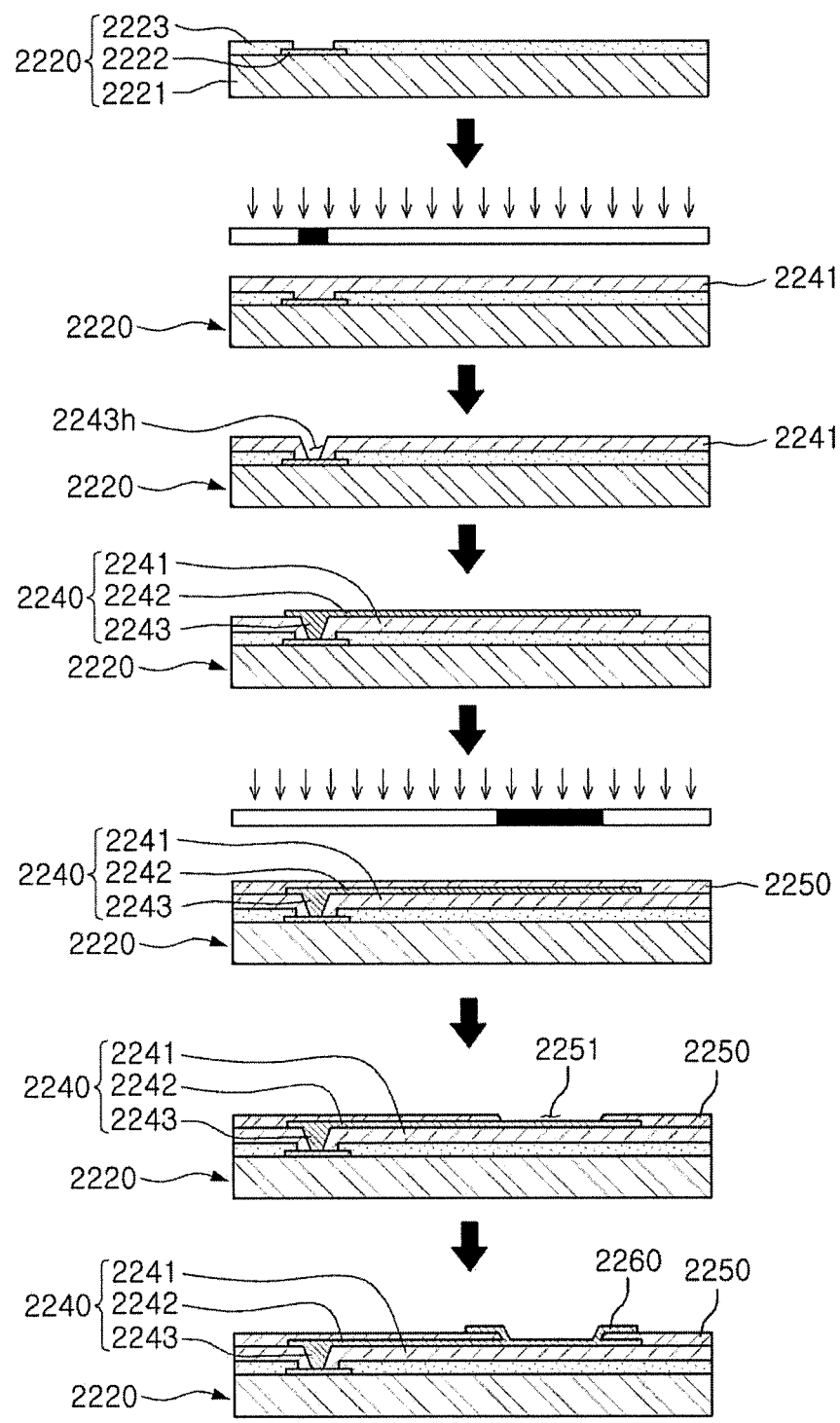
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A through 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
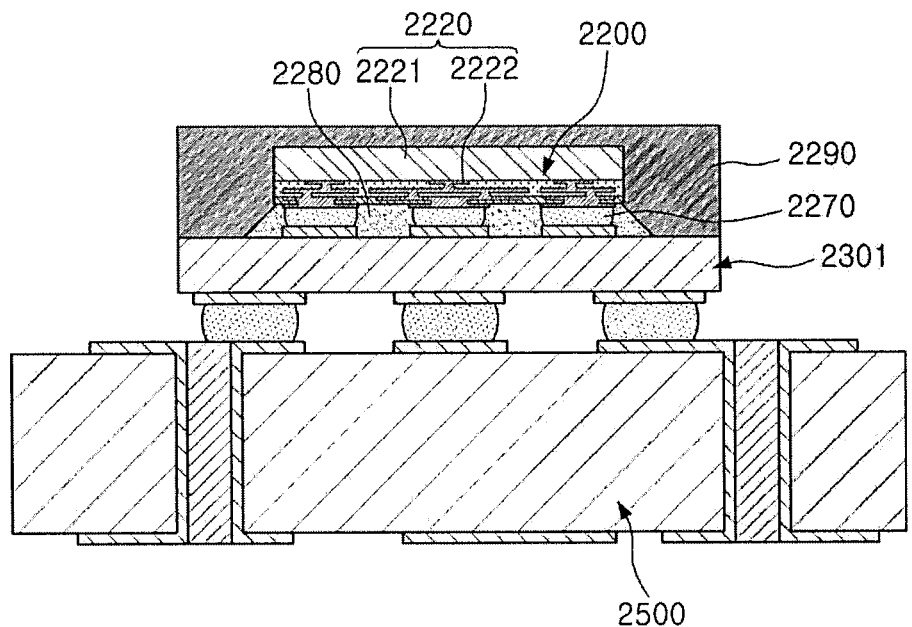
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
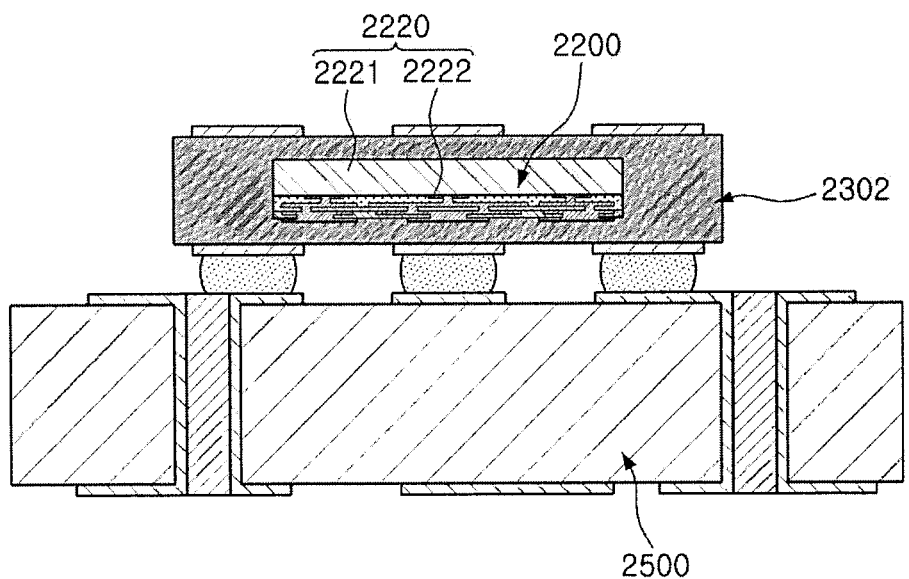
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
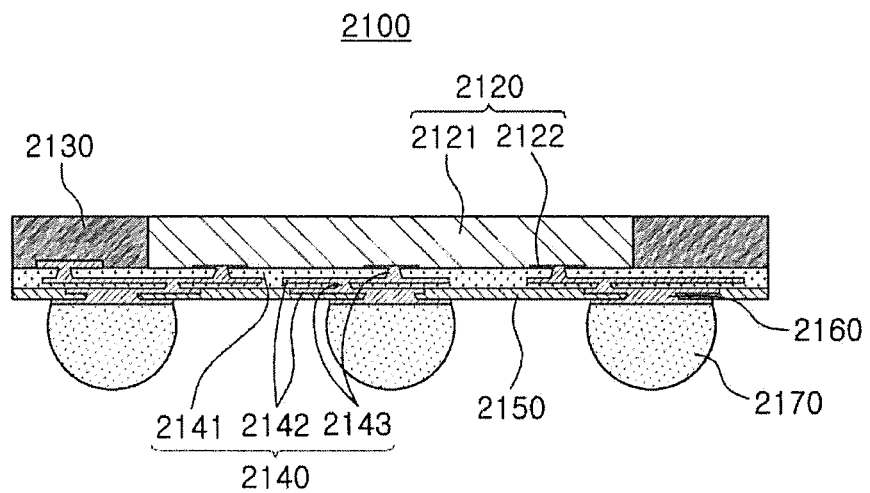
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
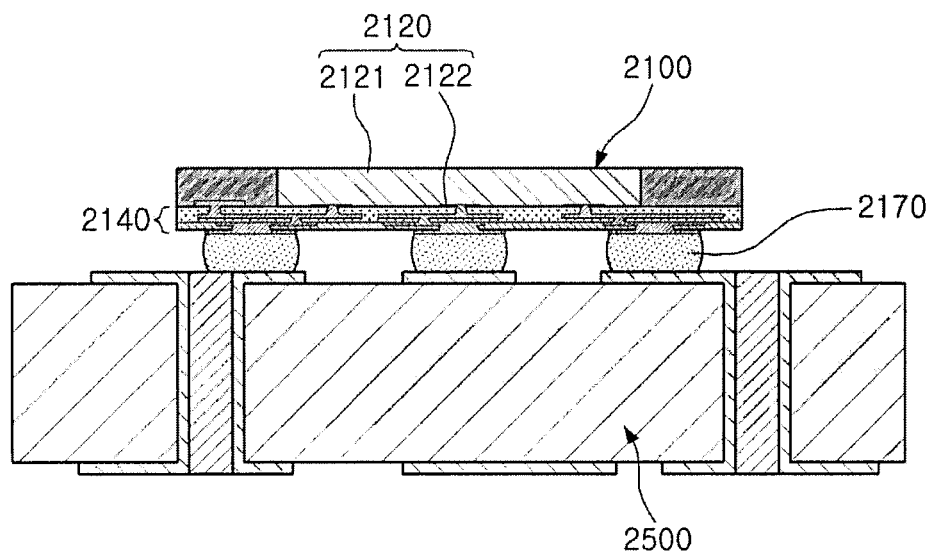
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
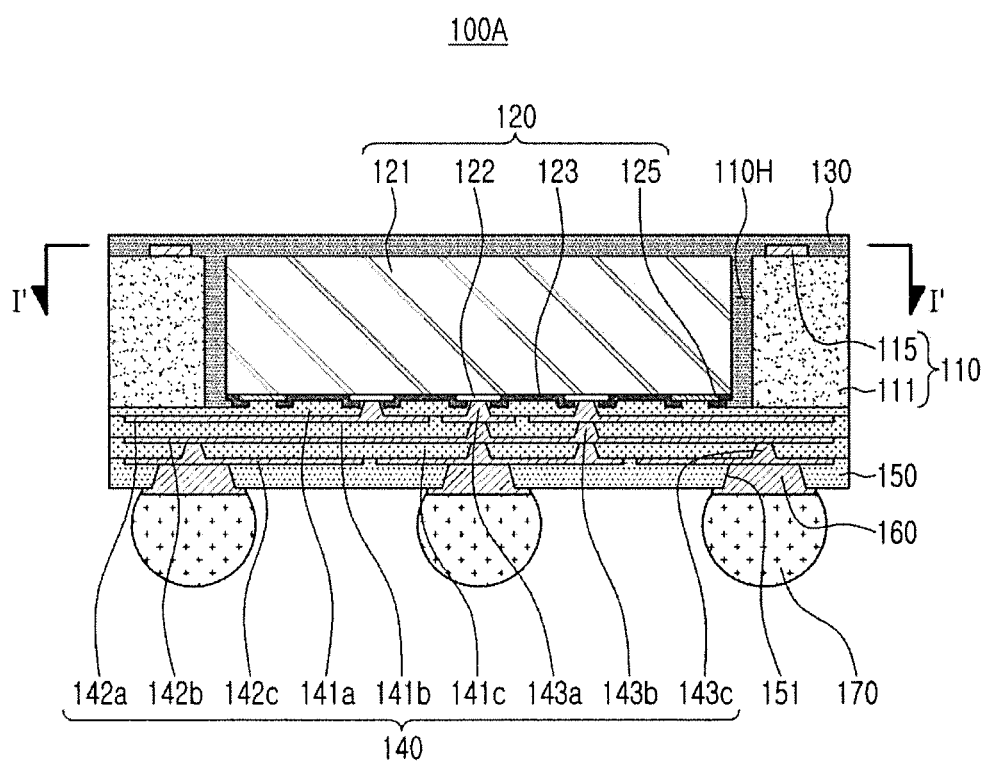
FIG. 9 is a schematic cross-sectional view illustrating an example of a fan-out semiconductor package.

FIG. 9 is a schematic cross-sectional view illustrating an example of a fan-out semiconductor package.

Figure 10A:
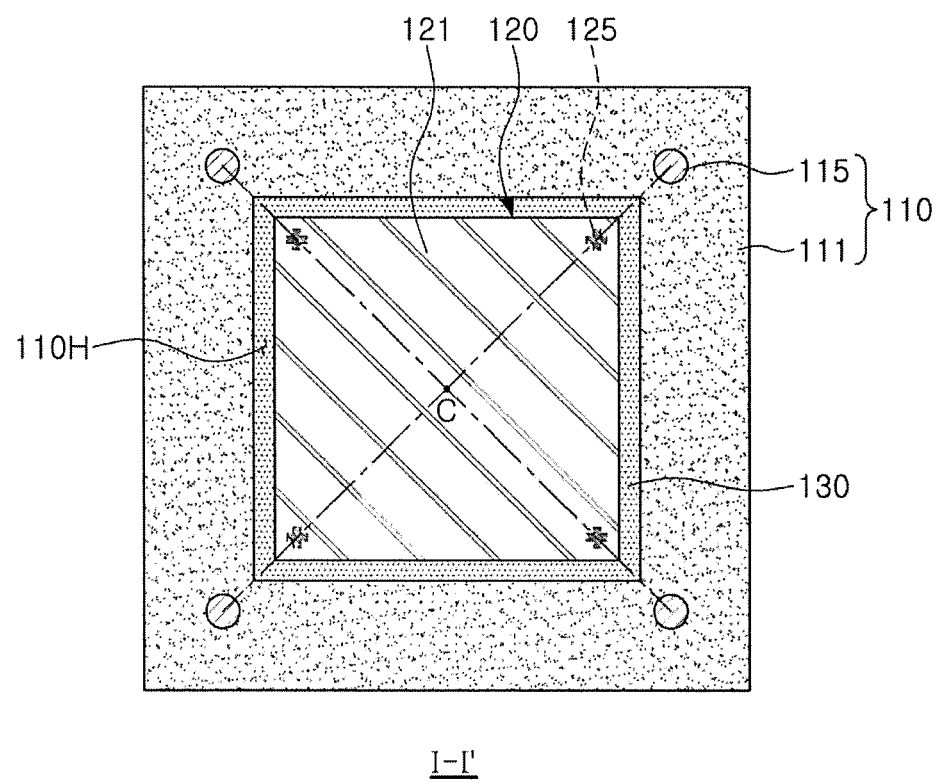
FIGS. 10A and 10B are schematic plan views taken along line I-I' of the fan-out semiconductor package of FIG. 9.
Figure 10B:
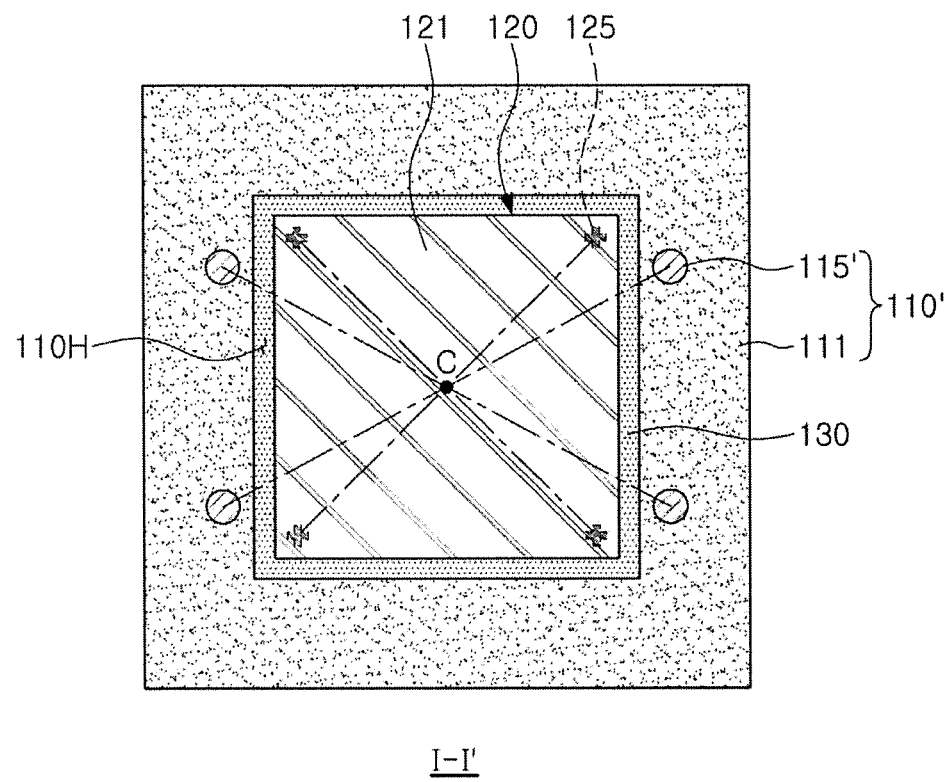

FIGS. 10A and 10B are schematic plan views taken along line I-I' of the fan-out semiconductor package of FIG. 9.

Figure 11A:
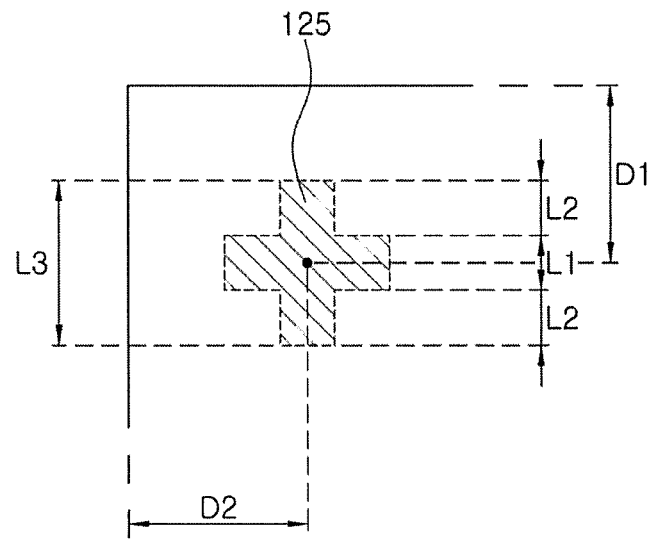
FIGS. 11A through 11C are schematic plan views illustrating examples of second fiducial marks of the fan-out semiconductor package of FIG. 9.
Figure 11B:
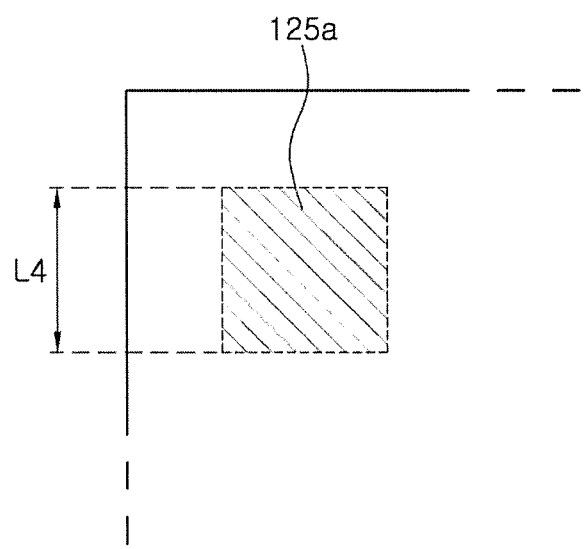
Figure 11C:
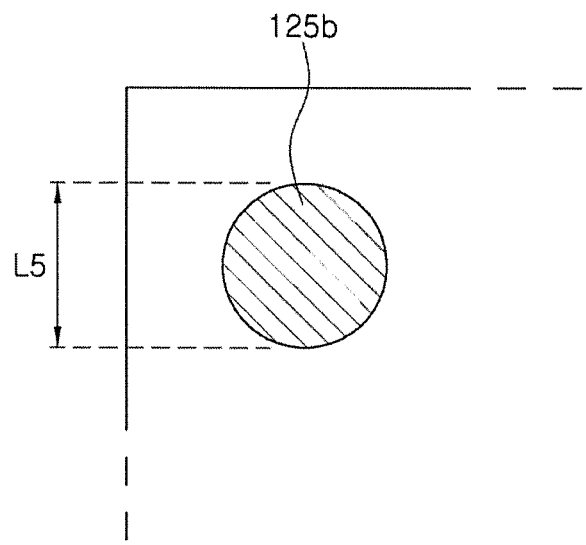

FIGS. 11A through 11C are schematic plan views illustrating examples of second fiducial marks of the fan-out semiconductor package of FIG. 9.

Referring to FIGS. 9 through 10B, a fan-out semiconductor package 100A according to an exemplary embodiment in the present disclosure may include a core member 110 having a through-hole 110H and having first fiducial marks 115 disposed on an upper surface thereof, a semiconductor chip 120 disposed in the through-hole 110H of the core member 110 and having an active surface having connection pads 122 and second fiducial marks 125 disposed thereon and an inactive surface opposing the active surface, an encapsulant 130 encapsulating at least portions of the core member 110 and the semiconductor chip 120, a connection member 140 disposed on the core member 110 and the active surface of the semiconductor chip 120, a passivation layer 150 disposed on the connection member 140, underbump metal layers 160 disposed in openings 151 of the passivation layer 150, and electrical connection structures 170 disposed on the passivation layer 150 and connected to the underbump metal layers 160.

The fan-out semiconductor package 100A may include the first fiducial marks 115 formed on the core member 110 and the second fiducial marks 125 formed on the semiconductor chip 120. The first fiducial marks 115 may be disposed on an upper surface of a core insulating layer 111 in the vicinity of the through-hole 110H of the core member 110. The second fiducial marks 125 may be disposed on a lower surface of the semiconductor chip 120, which is the active surface of the semiconductor chip 120, and may be disposed side-by-side with the connection pads 122. Therefore, the first fiducial marks 115 and the second fiducial marks 125 may be disposed on different levels. The fiducial marks 115 and the second fiducial marks 125 may serve as fiducial marks for aligning positions of the semiconductor chip 120 and the core member 110 with each other when the semiconductor chip 120 is disposed in the through-hole 110H of the core member 110. The second fiducial marks 125 may serve as alignment marks or alignment keys in a process of forming the connection member 140.

As illustrated in FIG. 10A, the first fiducial marks 115 may be disposed to be symmetrical to each other in relation to the center C of the through-hole 110H on a plane. The second fiducial marks 125 may also be disposed to be symmetrical to each other in relation to the center C of the semiconductor chip 120 on a plane. When the semiconductor chip 120 is disposed at the middle of the through-hole 110H as in the exemplary embodiment, the center C of the through-hole 110H and the center C of the semiconductor chip 120 may coincide with each other, but a disposition of the semiconductor chip 120 is not limited thereto. Two pairs of first fiducial marks 115 and two pairs of second fiducial marks 125 may be disposed to be symmetrical to each other in relation to the center C of the semiconductor chip 120. Therefore, the number of each of first fiducial marks 115 and second fiducial marks 125 may be four, but is not limited thereto.

The first fiducial marks 115 may be disposed adjacent to the through-hole 110 in a fan-out region, and may be disposed outside corners of the through-hole 110H, that is, outside respective vertices or corners of the semiconductor chip 120. The second fiducial marks 125 may be disposed adjacent to the respective vertices of the semiconductor chip 125. As illustrated in FIG. 10A, the first fiducial marks 115 may be disposed on diagonal lines extending from the center C of the through-hole 110H on the plane, and the second fiducial marks 125 may be disposed on diagonal lines extending from the center C of the semiconductor chip 120 on the plane. The diagonal lines may be lines passing through the respective vertices of the semiconductor chip 120 and the corners of the through-hole 110H while passing through the center C of the through-hole 110H and the semiconductor chip 120. Therefore, the center of the first fiducial marks 115 may coincide with that of the second fiducial marks 125, and the centers of the first and second fiducial marks 115 and 125 may correspond to the center C of the semiconductor chip 120. However, dispositions of the first fiducial marks 115 and the second fiducial marks 125 are not limited thereto. That is, as illustrated in FIG. 10B, first fiducial marks 115' of a core member 110' may also be disposed side-by-side in pairs outside of sidewalls of the through-hole 110H opposing each other. Also in this case, the first fiducial marks 115' may be symmetrical to each other on the center C of the through-hole C on the plane.

The respective components included in the fan-out semiconductor package 100A according to the exemplary embodiment will hereinafter be described in more detail.

The core member 110 may improve rigidity of the fan-out semiconductor package 100A depending on certain materials, and serve to secure uniformity of a thickness of the encapsulant 130. When through-wirings, or the like, are formed in the core member 110, the fan-out semiconductor package 100A may be utilized as a package-on-package (POP) type package. The core member 110 may have the through-hole 110H. The through-hole 110H may have a rectangular shape corresponding to that of the semiconductor chip 120, but is not limited thereto. That is, the through-hole 110H may have a rectangular shape different from that of the semiconductor chip 120. The semiconductor chip 120 may be disposed in the through-hole 110H to be spaced apart from the core member 110 by a predetermined distance. Side surfaces of the semiconductor chip 120 may be surrounded by the core member 110. However, such a form is only an example and may be variously modified to have other forms, and the core member 110 may perform another function depending on such a form.

The core member 110 may include the core insulating layer 111. An insulating material may be used as a material of the core insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. The core member 110 may serve as a support member.

The first fiducial marks 115 may be disposed on the core insulating layer 111 of the core member 110. Each of the first fiducial marks 115 may have a circular shape on the plane, but is not limited thereto. Each of the first fiducial marks 115 may have a size greater than that of each of the second fiducial marks 125 of the semiconductor chip 120. For example, each of the first fiducial marks 115 may have a diameter in a range of 200 μm to 250 μm. This diameter may be a diameter determined in consideration of visibility, and each of the first fiducial marks 115 may be formed to have a size greater than that of each of the second fiducial marks 125 formed in a region having a high degree of integration. A material of each of the first fiducial marks 115 may be a conductive material such as copper (Cu), aluminum (Al), silver (Ag), tin (Sn), gold (Au), nickel (Ni), lead (Pb), titanium (Ti), or alloys thereof. However, the material of each of the first fiducial marks 115 is not limited to the conductive material, but may be a material that may be distinguished and recognized from the core insulating layer 111.

The semiconductor chip 120 may be an integrated circuit (IC) provided in an amount of several hundred to several million or more elements integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM and a flash memory), or the like. In addition, the abovementioned elements may also be combined with each other and be disposed.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 and the second fiducial marks 125 may be formed on the body 121, and may be an oxide film, a nitride film, or the like, or a double layer of an oxide layer and a nitride layer. Lower surfaces of the connection pad 122 and the second fiducial marks 125 may have a step with respect to a lower surface of the encapsulant 130 through the passivation layer 123. Resultantly, a phenomenon that the encapsulant 130 bleeds into the lower surfaces of the connection pad 122 and the second fiducial marks 125 may be prevented to some degree. An insulating layer (not illustrated), and the like, may also be further disposed in other required positions. The semiconductor chip 120 may be a bare die, a redistribution layer (not illustrated) may further be formed on the active surface of the semiconductor chip 120, if necessary, and bumps (not illustrated), or the like, may be connected to the connection pads 122.

The second fiducial marks 125 may be disposed together with the connection pads 122 on the lower surface of the semiconductor chip 120. Each of the second fiducial marks 125 may be formed of the same material as that of each of the connection pad 122, and the material of each of the second fiducial marks 125 may be a conductive material such as aluminum (Al).

Referring to FIG. 11A, the second fiducial mark 125 may have a cross shape on the plane. The center of the second fiducial mark 125 may be disposed within first and second distances D1 and D2 from one end or the edge of the semiconductor chip 120, in a corner region of the semiconductor chip 120. The first and second distances D1 and D2 may be the same as or smaller than 150 µm, and may be the same as or different from each other. As described above, the second fiducial marks 125 may be disposed adjacent to the vertices of the semiconductor chip 120 and be thus spaced apart from wiring patterns such as the connection pads 122, or the like, disposed in the vicinity of the second fiducial marks 125, such that the second fiducial marks 125 may not be erroneously recognized to be other patterns in an equipment in a process. According to exemplary embodiments, regions in which other patterns are not disposed may be formed by the first and second distances D1 and D2 from the center in the vicinity of the second fiducial marks 125.

In the second fiducial mark 125 having the cross shape, a length of a side surface of a central region may be a first length L1, and a length of a side surface of each of upper and lower regions may be a second length L2. For example, the first length L1 may be 20 µm or more, and the second length L2 may be greater than or the same as the first length L1. An entire length L3 of one side of the second fiducial mark 125 may be in a range of 60 µm to 100 µm. When the entire length of one side of the second fiducial mark 125 is smaller than the range, it may be difficult to distinguish and recognize the second fiducial marks 125 from the wiring patterns disposed in the vicinity of the second fiducial marks 125, and when the entire length of one side of the second fiducial mark 125 is greater than the range, it may be difficult to dispose the wiring patterns in the vicinity of the second fiducial marks 125. However, a size of the second fiducial mark 125 may be variously modified according to exemplary embodiments, and may be selected in consideration of a size and a degree of integration of the wiring patterns such as the connection pads 122 disposed in the vicinity of the second fiducial marks 125. Referring to FIGS. 11B and 11C, second fiducial marks 125a and 125b may have a rectangular shape and a circular shape, respectively. That is, shapes of the second fiducial marks 125a and 125b may be variously modified. When the second fiducial mark 125a has the rectangular shape, a length L4 of one side of the second fiducial mark 125a may be in a range of 60 µm to 100 µm. When the second fiducial mark 125b has the circular shape, a diameter L5 of the second fiducial mark 125b may be in a range of 60 µm to 100 µm.

The encapsulant 130 may protect the core member 110, the semiconductor chip 120, and the like. An encapsulation form of the encapsulant 130 is not particularly limited, but may be a form in which the encapsulant 130 surrounds at least portions of the core member 110, the semiconductor chip 120, and the like. For example, the encapsulant 130 may cover the core member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection member 140. Meanwhile, the encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions. The connection member 140 may include a first insulating layer 141a disposed on the core member 110 and the active surface of the semiconductor chip 120, a first redistribution layer 142a disposed on the first insulating layer 141a, first vias 143a connecting the first redistribution layer 142a and the connection pads 122 of the semiconductor chip 120 to each other, a second insulating layer 141b disposed on the first insulating layer 141a, a second redistribution layer 142b disposed on the second insulating layer 141b, second vias 143b penetrating through the second insulating layer 141b and connecting the first and second redistribution layers 142a and 142b to each other, a third insulating layer 141c disposed on the second insulating layer 141b, a third redistribution layer 142c disposed on the third insulating layer 141c, and third vias 143c penetrating through the third insulating layer 141c and connecting the second and third redistribution layers 142b and 142c to each other. The first to third redistribution layers 142a, 142b, and 142c may be electrically connected to the connection pads 122 of the semiconductor chip 120. The first to third redistribution layers 142a, 142b, and 142c may not be connected to the second fiducial marks 125 of the semiconductor chip 120.

A material of each of the insulating layers 141a, 141b, and 141c may be an insulating material. In this case, in addition to the insulating material as described above, a photosensitive insulating material such as a PID resin may also be used as the insulating material. That is, the insulating layers 141a, 141b, and 141c may be photosensitive insulating layers. When the insulating layers 141a, 141b, and 141c have photosensitive properties, the insulating layers 141a, 141b, and 141c may be formed to have a smaller thickness, and fine pitches of the vias 143a, 143b, and 143c may be achieved more easily. The insulating layers 141a, 141b, and 141 may be photosensitive insulating layers including an insulating resin and an inorganic filler. When the insulating layers 141a, 141b, and 141c are multiple layers, the materials of the insulating layers 141a, 141b, and 141c may be the same as each other, and may also be different from each other, if necessary. When the insulating layers 141a, 141b, and 141c are the multiple layers, the insulating layers 141a, 141b, and 141c may be integrated with one another depending on a process, such that boundaries thereamong may also not be apparent. The number of insulating layers may be more than that illustrated in the drawing.

The redistribution layers 142a, 142b, and 142c may serve to substantially redistribute the connection pads 122. A material of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of their corresponding layers. For example, the redistribution layers 142a, 142b, and 142c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142a, 142b, and 142c may include via pad patterns, electrical connection structures pad patterns, and the like.

The vias 143a, 143b, and 143c may electrically connect the redistribution layers 142a, 142b, and 142c, the connection pads 122, and the like, formed on different layers to each other, resulting in an electrical path in the fan-out semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have any shape known in the related art, such as a tapered shape, a cylindrical shape, and the like.

The passivation layer 150 may protect the connection member 140 from external physical or chemical damage. The passivation layer 150 may have openings 151 exposing at least portions of the third redistribution layer 142c of the connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100A. The underbump metal layers 160 may be connected to the third redistribution layer 142c of the connection member 140 exposed through the openings 151 of the passivation layer 150. The underbump metal layers 160 may be formed in the openings 151 of the passivation layer 150 by any known metallization method using any known conductive metal such as a metal, but are not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the passivation layer 150, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounting technology (SMT) component including an inductor, a capacitor, or the like, may be disposed on a surface of the passivation layer 150, if necessary.

FIGS. 12A through 12F are schematic views illustrating an example of processes of manufacturing the fan-out semiconductor package.

Figure 12A:
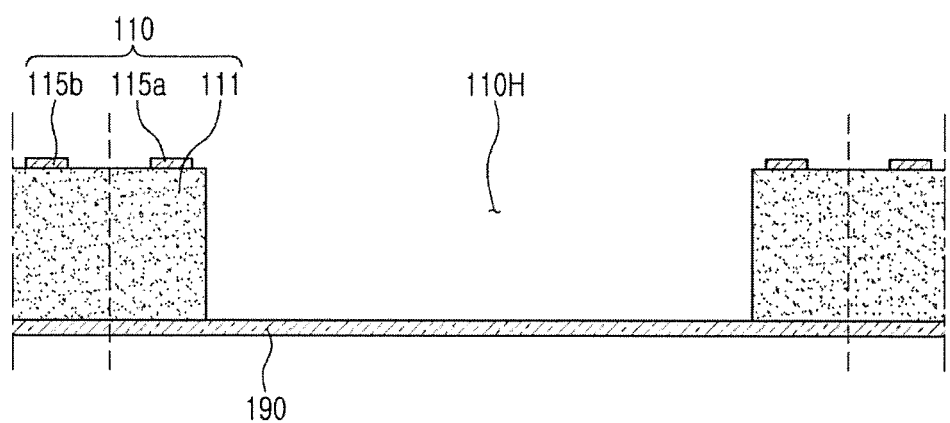
FIGS. 12A through 12F are schematic views illustrating an example of processes of manufacturing the fan-out semiconductor package.

Referring to FIG. 12A, the through-hole 110H penetrating through upper and lower surfaces of the core member 110 may be formed in the core member 110, and an adhesive film 190 may be attached to one surface of the core member 110. First fiducial marks 115a and 115b may be disposed on the upper surface of the insulating layer 111 of the core member 110. In an exemplary embodiment in which the core member 110 includes a wiring layer, the first fiducial marks 115a and 115b may be formed together with the wiring layer. The first fiducial marks 115a and 115b may be disposed, respectively, inside and outside a region cut in a subsequent process, which is a region denoted by a broken line in FIG. 12A. According to exemplary embodiments, the first fiducial marks 115a and 115b may be disposed inside and/or outside the cut region. The first fiducial marks 115b disposed outside the cut region may be disposed in a scribe line region. The through-hole 110H may be formed using a mechanical drill and/or a laser drill. However, the through-hole 110H is not limited thereto, and may also be formed by a sandblast method using particles for polishing, a dry etching method using plasma, or the like. A size, a shape, or the like, of the through-hole 110H may be designed depending on a size, a shape, the number, or the like, of semiconductor chips 120 to be mounted. Any material that may fix the core member 110 may be used as the adhesive film 190. As a non-restrictive example of this material, any known tape, or the like, may be used. An example of any known tape may include a thermosetting adhesive tape of which adhesion is weakened by heat treatment, an ultraviolet-curable adhesive tape of which adhesion is weakened by ultraviolet ray irradiation, or the like.

Figure 12B:
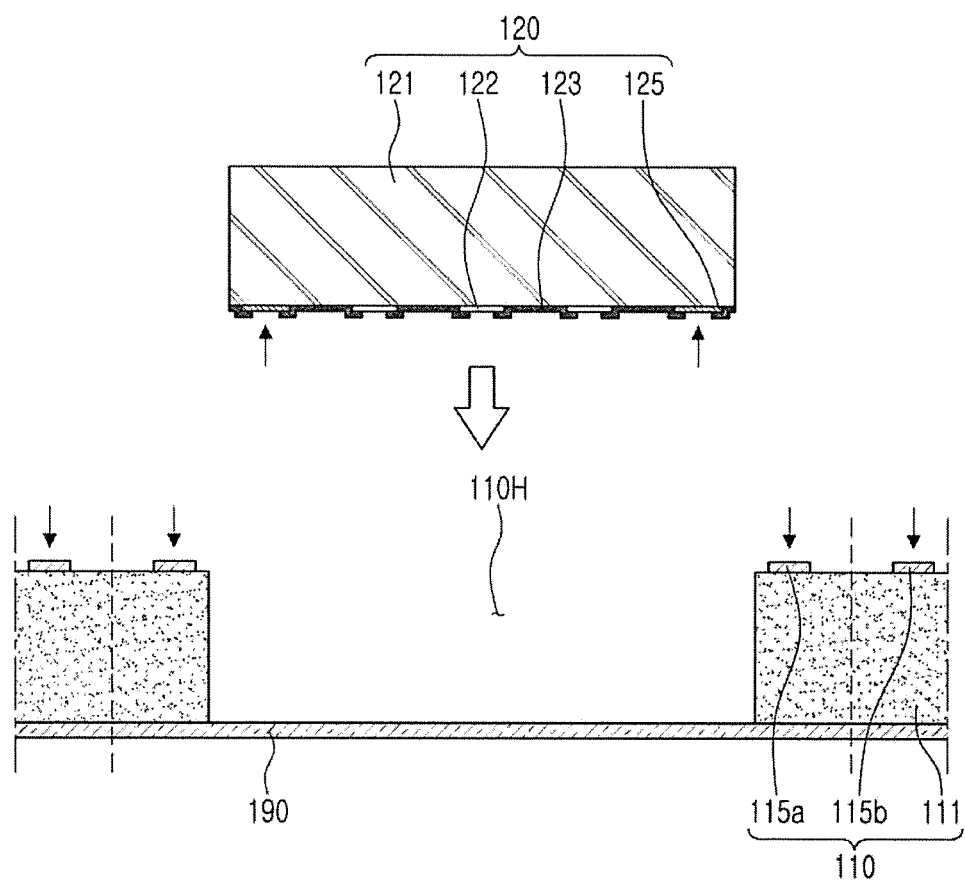
Figure 12C:
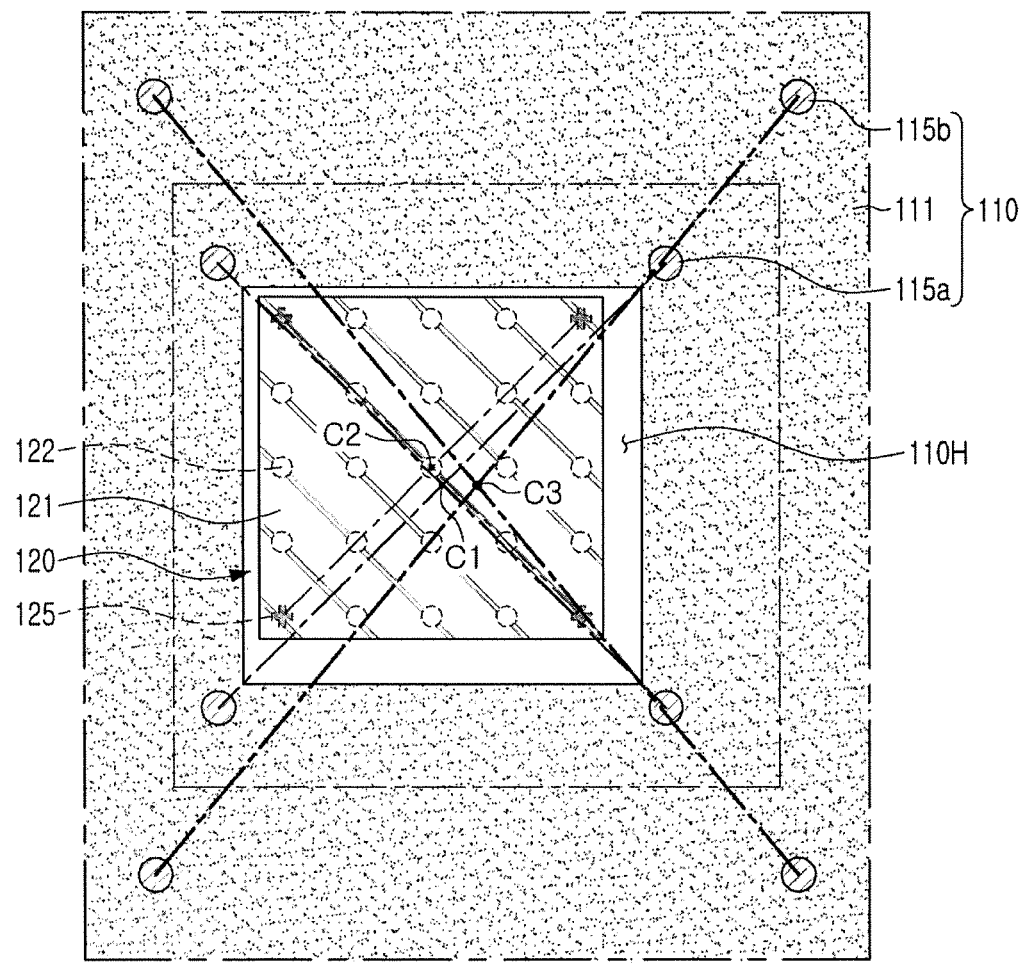

Referring to FIGS. 12B and 12C, the semiconductor chip 120 may be disposed in the through-hole 110H. The semiconductor chip 120 may be disposed by, for example, a method of attaching the semiconductor chip 120 to the adhesive film 190 in the through-hole 110H. The semiconductor chip 120 may be disposed in a face-down form so that the connection pads 122 and the second fiducial marks 125 are attached to the adhesive film 190. In the present process, in order to accurately dispose the semiconductor chip 120 in the through-hole 110H, the first fiducial marks 115a and 115b and the second fiducial marks 125 may be recognized using a recognition device such as a camera, or the like, as illustrated by arrows in FIGS. 12B and 12C. As an example, when the semiconductor chip 120 is disposed at the center of the through-hole 110H on the basis of the first fiducial marks 115a disposed inside the cut region as illustrated in FIG. 12C, a first center point C1 may be found by recognizing the first fiducial marks 115a, a second center point C2 may be found by recognizing the second fiducial marks 125, and the semiconductor chip 120 may be disposed so that the second center point C2 is positioned at the first center point C1. Alternatively, as another example, when the semiconductor chip 120 is disposed at the center of the through-hole 110H on the basis of the first fiducial marks 115b disposed outside the cut region, a third center point C3 may be found by recognizing the first fiducial marks 115b, and a position of the semiconductor chip 120 may be corrected so that a second center point C2 is corrected from the third center point C3 by a calculated value to be positioned at the center of the through-hole 110H, that is, the first center point C1. As described above, even in a case in which the through-hole 110H is not positioned at the center of the fan-out semiconductor package or the semiconductor chip 120 is not to be disposed at the center of the through-hole 110H, a position difference may be compensated for from the center points by the first fiducial marks 115a and 115b, and the semiconductor chip 120 may then be disposed. The first to third center points C1, C2, and C3 may be converted into position coordinates. Therefore, the position of the semiconductor chip 120 may be corrected. In addition, the first to third center points C1, C2, and C3 and positions of the first and second fiducial marks 115 and 125 may be converted into position coordinates to calculate a rotation angle of the semiconductor chip 120, and a direction of the semiconductor chip 120 may be corrected using the rotation angle of the semiconductor chip 120. The semiconductor chip 120 may be disposed without being shifted or tilted, by such an aligning method, and dedicated marks for alignment may be used to improve accuracy of the alignment.

Figure 12D:
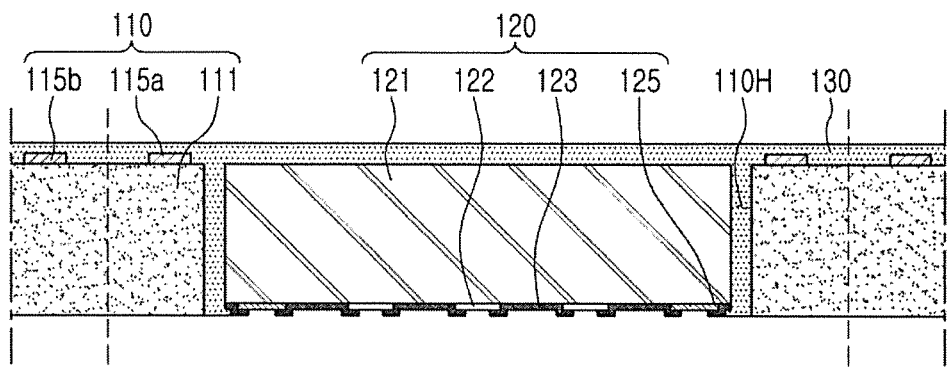

Referring to FIG. 12D, the semiconductor chip 120 may be encapsulated using the encapsulant 130, and the adhesive film 190 may be peeled off. The encapsulant 130 may encapsulate the core member 110 and at least the inactive surface of the semiconductor chip 120, and may fill a space within the through-hole 110H. The encapsulant 130 may be formed by any known method. For example, the encapsulant 130 may be formed by laminating a precursor of the encapsulant 130 and then hardening the precursor. Alternatively, the encapsulant 130 may be formed by a method of applying a pre-encapsulant to the adhesive film 190 to encapsulate the semiconductor chip 120 and then hardening the pre-encapsulant. The semiconductor chip 120 may be fixed by the hardening. As the method of laminating the precursor, for example, a method of performing a hot press process of pressing the precursor for a predetermined time at a high temperature, decompressing the precursor, and then cooling the precursor to room temperature, cooling the precursor in a cold press process, and then separating a work tool, or the like, may be used. As a method of applying the pre-encapsulant, for example, a screen printing method of applying ink with a squeegee, a spray printing method of applying ink in a mist form, or the like, may be used. A method of peeling off the adhesive film 190 is not particularly limited, but may be any known method. For example, when the thermosetting adhesive tape of which adhesion is weakened by heat treatment, the ultraviolet-curable adhesive tape of which adhesion is weakened by ultraviolet ray irradiation, or the like, is used as the adhesive film 190, the adhesive film 190 may be peeled off after the adhesion of the adhesive film 190 is weakened by heat-treating the adhesive film 190 or may be peeled off after the adhesion of the adhesive film 190 is weakened by irradiating an ultraviolet ray to the adhesive film 190.

Figure 12E:
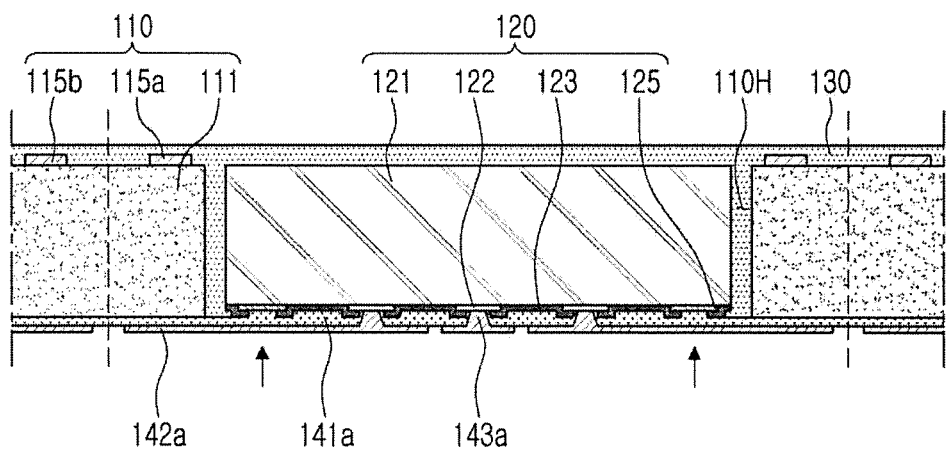

Referring to FIG. 12E, a portion of the connection member 140 may be formed on the core member 110 and the active surface of the semiconductor chip 120 from which the adhesive film 190 is removed. The first insulating layer 141a may be formed on a surface of the semiconductor chip 120 on which the connection pads 122 and the second fiducial marks 125 are formed, the first vias 143a penetrating through the first insulating layer 141a and connected to the connection pads 122 may be formed, and the first redistribution layer 142a connected to the first via 143a may be formed on the first insulating layer 141a. The first insulating layer 141a may be formed of a lamination method, an applying method, or the like, the first redistribution layer 142a may be formed by a plating process, and the first vias 143a may be formed together with the first redistribution layer 142a by the plating process. However, methods of forming the first insulating layer 141a, the first redistribution layer 142a, and the first via 143 are not limited thereto. For example, the first vias 143a may also be formed by forming holes by a photolithography method, a mechanical drill, a laser drill, or the like, and filling the holes with a conductive material by plating, or the like, depending on a material of the first insulating layer 141a. In the present process, the first insulating layer 141a may be formed of a transparent or translucent material, and the second fiducial marks 125 may thus be recognized from the bottom. Therefore, the second fiducial marks 125 may be used as alignment keys in an exposure process for forming the first redistribution layer 142a and the first vias 143a, such that matching between the connection member 140 and the semiconductor chip 120 may be improved.

Figure 12F:
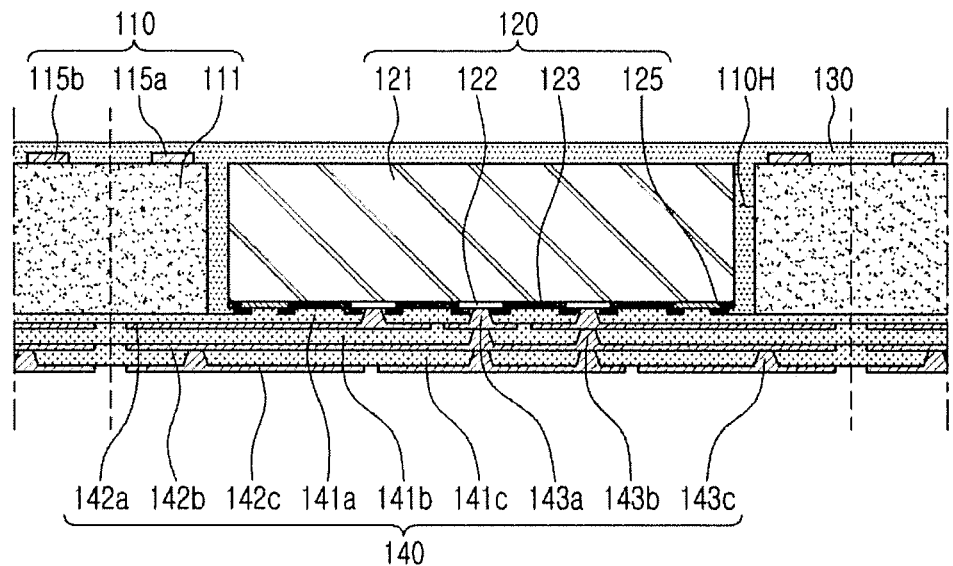

Referring to FIG. 12F, the remaining regions of the connection member 140 may be formed. The connection member 140 may be finally manufactured by sequentially forming the second and third insulating layers 141b and 141c and then forming the second and third redistribution layers 142b and 142c and the second and third vias 143b and 143c on and in the second and third insulating layers 141b and 141c, respectively.

Next, again referring to FIG. 9, the passivation layer 150 covering the third redistribution layer 142c may be formed, the openings 151 exposing at least portions of the third redistribution layer 142c may be formed in the passivation layer 150, and the underbump metal layers 160 may be formed in the openings 151. The passivation layer 150 may also be formed by a method of laminating a precursor of the passivation layer 150 and then hardening the precursor, a method of applying a material for forming the passivation layer 150 and then hardening the material, or the like. The underbump metal layers 160 may be formed by any known metallization method.

The electrical connection structures 170 may be formed on the underbump metal layers 160, if necessary. A method of forming the electrical connection structures 170 is not particularly limited. That is, the electrical connection structures 170 may be formed by any method well-known in the related art depending on their structures or forms. The electrical connection structures 170 may be fixed by reflow, and portions of the electrical connection structures 170 may be embedded in the passivation layer 150 in order to enhance fixing force, and the remaining portions of the electrical connection structures 170 may be externally exposed, such that reliability may be improved. In some cases, only components up to the underbump metal layers 160 may be formed, and the other components may be formed, if necessary, by a separate process in a client purchasing the fan-out semiconductor package 100A.

Meanwhile, a series of processes may be processes of preparing the core member 110 having a large size, manufacturing a plurality of fan-out semiconductor packages 100A through the abovementioned processes, and then singulating the plurality of fan-out semiconductor packages into individual fan-out semiconductor packages 100A through a cutting process in order to facilitate mass production. In this case, productivity may be excellent.

Figure 13:
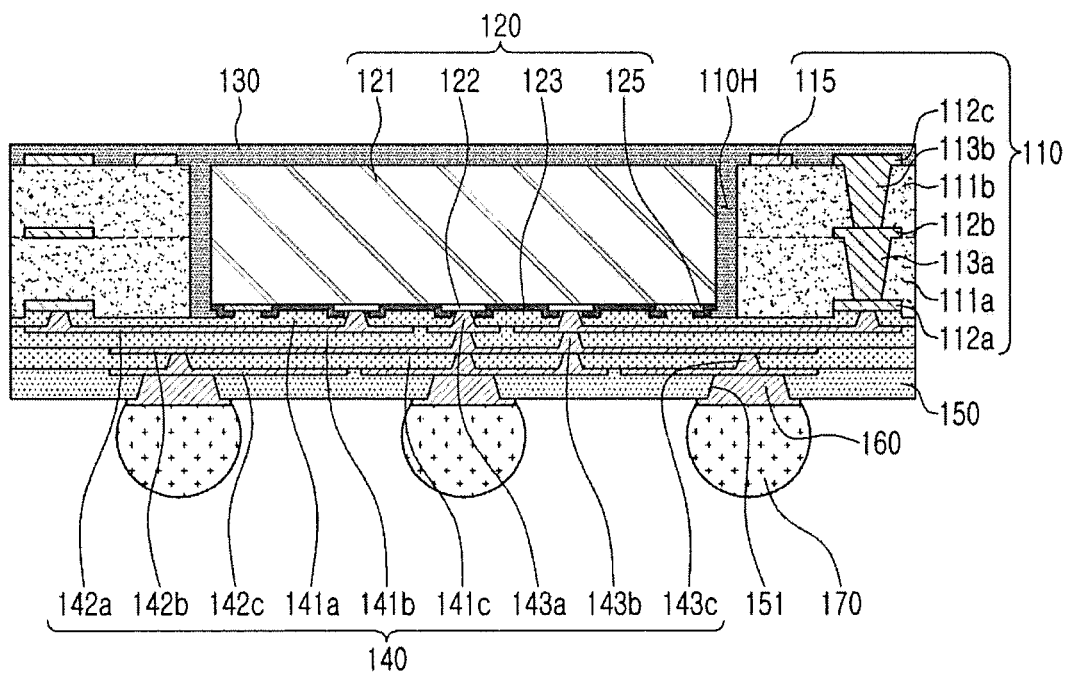
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, in a fan-out semiconductor package 100B according to another exemplary embodiment in the present disclosure, a core member 110 may include a first core insulating layer 111a in contact with a connection member 140, a first wiring layer 112a in contact with the connection member 140 and embedded in the first core insulating layer 111a, a second wiring layer 112b disposed on the other surface of the first core insulating layer 111a opposing one surface of the first core insulating layer 111a in which the first wiring layer 112a is embedded, a second core insulating layer 111b disposed on the first core insulating layer 111a and covering the second wiring layer 112b, and a third wiring layer 112c disposed on the second core insulating layer 111b. The first to third wiring layers 112a, 112b, and 112c may be electrically connected to connection pads 122. The first and second wiring layers 112a and 112b and the second and third wiring layers 112b and 112c may be electrically connected to each other through first and second vias 113a and 113b penetrating through the first and second core insulating layers 111a and 111b, respectively.

When the first wiring layer 112a is embedded in the first core insulating layer 111a, a step generated due to a thickness of the first wiring layer 112a may be significantly reduced, and an insulating distance of the connection member 140 may thus become constant. That is, a difference between a distance from a first redistribution layer 142a of the connection member 140 to a lower surface of the first core insulating layer 111a and a distance from the first redistribution layer 142a of the connection member 140 to the connection pad 122 of a semiconductor chip 120 may be smaller than a thickness of the first wiring layer 112a. Therefore, a high density wiring design of the connection member 140 may be easy.

A lower surface of the first wiring layer 112a of the core member 110 may be disposed on a level above a lower surface of the connection pad 122 of the semiconductor chip 120. In addition, a distance between the first redistribution layer 142a of the connection member 140 and the first wiring layer 112a of the core member 110 may be greater than that between the first redistribution layer 142a of the connection member 140 and the connection pad 122 of the semiconductor chip 120. The reason is that the first wiring layer 112a may be recessed into the first core insulating layer 111a. As described above, when the first wiring layer 112a is recessed into the first core insulating layer 111a, such that the lower surface of the first core insulating layer 111a and the lower surface of the first wiring layer 112a have a step therebetween, a phenomenon in which a material of an encapsulant 130 bleeds to pollute the first wiring layer 112a may be prevented. The second wiring layer 112b of the core member 110 may be disposed on a level between an active surface and an inactive surface of the semiconductor chip 120. The core member 110 may be formed at a thickness corresponding to that of the semiconductor chip 120. Therefore, the second wiring layer 112b formed in the core member 110 may be disposed on the level between the active surface and the inactive surface of the semiconductor chip 120.

Thicknesses of the wiring layers 112a, 112b, and 112c of the core member 110 may be greater than those of redistribution layers 142a, 142b, and 142c of the connection member 140. Since the core member 110 may have a thickness equal to or greater than that of the semiconductor chip 120, the wiring layers 112a, 112b, and 112c may be formed to have large sizes depending on a scale of the core member 110. On the other hand, the redistribution layers 142a, 142b, 142c of the connection member 140 may be formed to have sizes relatively smaller than those of the wiring layers 112a, 112b, and 112c for thinness.

A material of each of the core insulating layers 111a and 111b is not particularly limited. For example, an insulating material may be used as the material of each of the core insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of corresponding layers. For example, the wiring layers 112a, 112b, and 112c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have any shape known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

A description for other configurations and an additional description, for example, contents for the first and second fiducial marks 115 and 125 described above with reference to FIGS. 9 through 10B, and the like, may be applied to the fan-out semiconductor package 100B according to another exemplary embodiment, and a detailed description thereof overlaps that described above, and is thus omitted.

Figure 14:
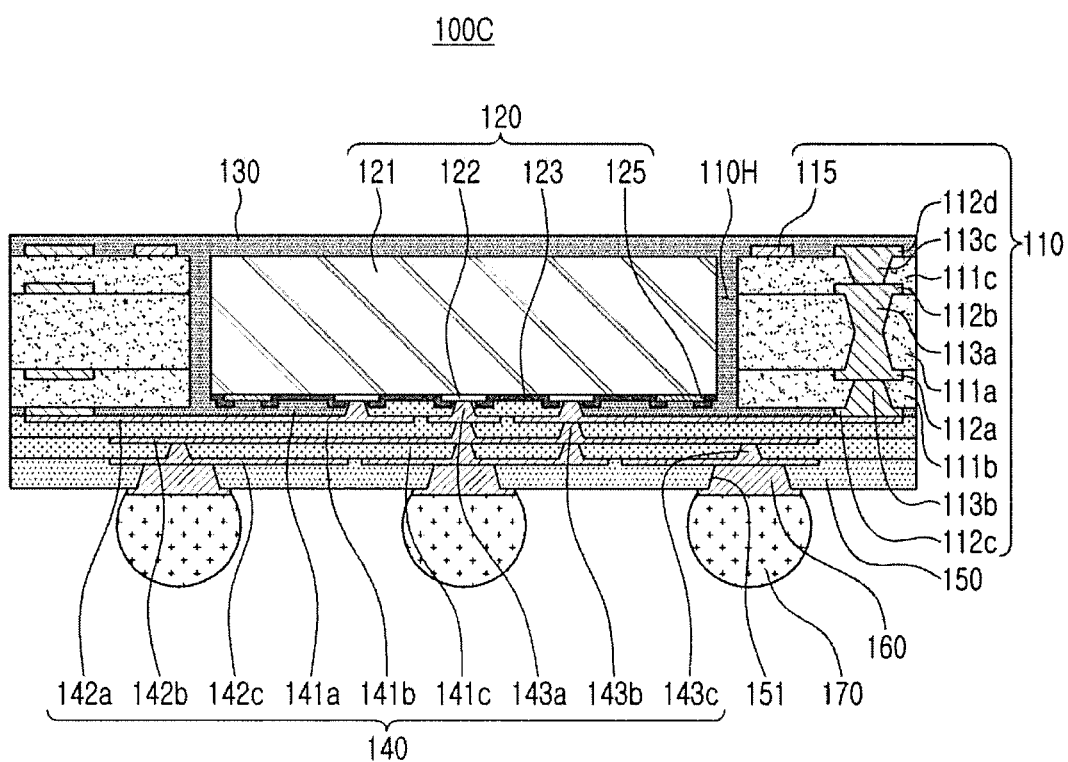
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, in a fan-out semiconductor package 100C according to another exemplary embodiment in the present disclosure, a core member 110 may include a first core insulating layer 111a, a first wiring layer 112a and a second wiring layer 112b disposed on opposite surfaces of the first core insulating layer 111a, respectively, a second core insulating layer 111b disposed on the first core insulating layer 111a and covering the first wiring layer 112a, a third wiring layer 112c disposed on the second core insulating layer 111b, a third core insulating layer 111c disposed on the first core insulating layer 111a and covering the second wiring layer 112b, and a fourth wiring layer 112d disposed on the third core insulating layer 111c. The first to fourth wiring layers 112a, 112b, 112c, and 112d may be electrically connected to connection pads 122. Since the core member 110 may include a larger number of wiring layers 112a, 112b, 112c, and 112d, a connection member 140 may further be simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c each penetrating through the first to third core insulating layers 111a, 111b, and 111c.

The first core insulating layer 111a may have a thickness greater than those of the second core insulating layer 111b and the third core insulating layer 111c. The first core insulating layer 111a may be basically relatively thick in order to maintain rigidity, and the second core insulating layer 111b and the third core insulating layer 111c may be introduced in order to form a larger number of wiring layers 112c and 112d. Similarly, the first vias 113a penetrating through the first core insulating layer 111a may have a diameter greater than those of second vias 113b and third vias 113c each penetrating through the second core insulating layer 111b and the third core insulating layer 111c. The first core insulating layer 111a may include an insulating material different from those of the second core insulating layer 111b and the third core insulating layer 111c. For example, the first core insulating layer 111a may be, for example, prepreg including a core material, a filler, and an insulating resin, and the second core insulating layer 111b and the third core insulating layer 111c may be an ABF or a PID film including a filler and an insulating resin. However, the materials of the first core insulating layer 111a and the second and third core insulating layers 111b and 111c are not limited thereto.

A lower surface of the third wiring layer 112c of the core member 110 may be disposed on a level below a lower surface of the connection pad 122 of a semiconductor chip 120. In addition, a distance between a first redistribution layer 142a of the connection member 140 and the third wiring layer 112c of the core member 110 may be smaller than that between the first redistribution layer 142a of the connection member 140 and the connection pad 122 of the semiconductor chip 120. The reason is that the third wiring layer 112c may be disposed on the second core insulating layer 111b in a protruding form, resulting in being in contact with the connection member 140. The first wiring layer 112a and the second wiring layer 112b of the core member 110 may be disposed on a level between an active surface and an inactive surface of the semiconductor chip 120. Since the core member 110 may be formed at a thickness corresponding to that of the semiconductor chip 120, the first wiring layer 112a and the second wiring layer 112b formed in the core member 110 may be disposed on the level between the active surface and the inactive surface of the semiconductor chip 120.

Thicknesses of the wiring layers 112a, 112b, 112c, and 112d of the core member 110 may be greater than those of redistribution layers 142a, 142b, and 142c of the connection member 140. Since the core member 110 may have a thickness equal to or greater than that of the semiconductor chip 120, the wiring layers 112a, 112b, 112c, and 112d may also be formed to have large sizes. On the other hand, the redistribution layers 142a, 142b, and 142c of the connection member 140 may be formed to have relatively small sizes for thinness.

A description for other configurations and an additional description, for example, contents for the first and second fiducial marks 115 and 125 described above with reference to FIGS. 9 through 10B, and the like, may be applied to the fan-out semiconductor package 100C according to another exemplary embodiment, and a detailed description thereof overlaps that described above, and is thus omitted.

Figure 15:
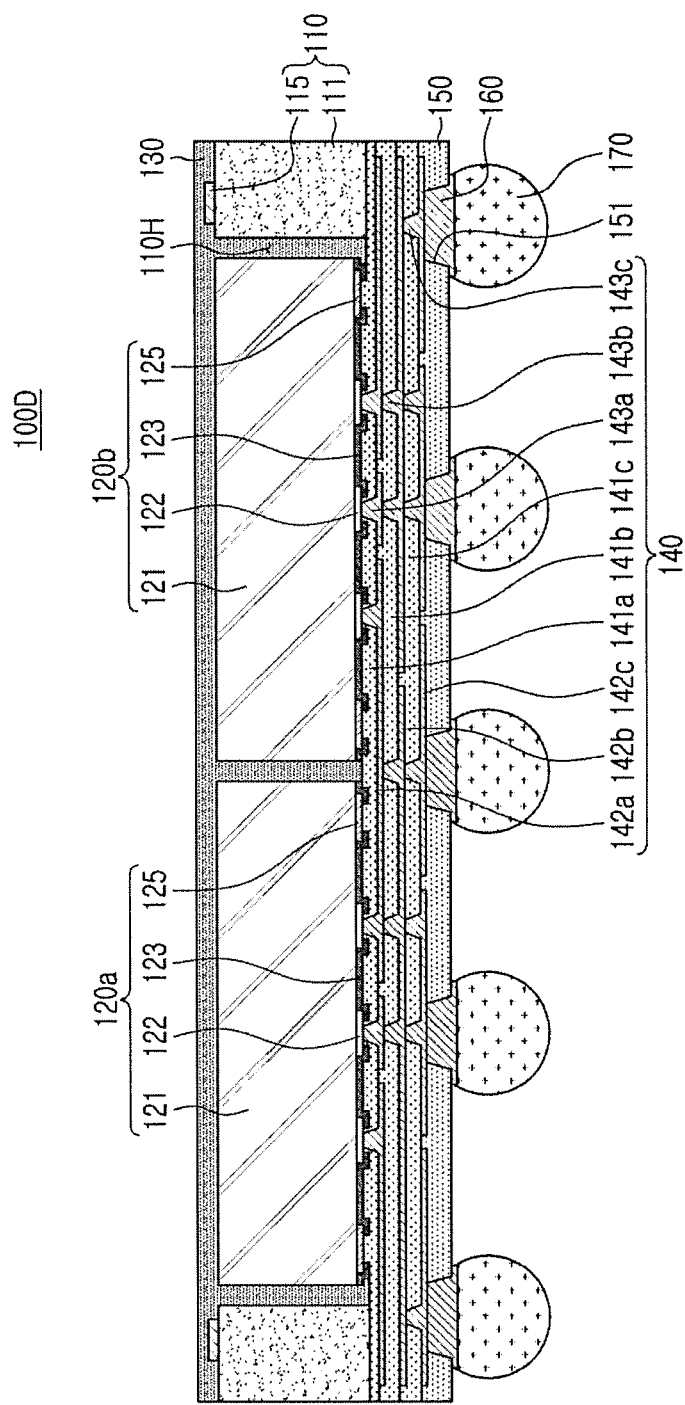
FIG. 15 is a schematic cross-sectional view illustrating another example of a fan-out semiconductor package.

FIG. 15 is a schematic cross-sectional view illustrating another example of a fan-out semiconductor package.

Referring to FIG. 15, a fan-out semiconductor package 100D according to another exemplary embodiment in the present disclosure may include a plurality of semiconductor chips 120a and 120b disposed therein. Each of the plurality of semiconductor chips 120a and 120b may have connection pads 122 and second fiducial marks 125, and the connection pads 122 may be redistributed by a connection member 140.

In the fan-out semiconductor package 100D, when the plurality of semiconductor chips 120a and 120b are mounted in the through-hole 110H, the plurality of semiconductor chips 120a and 120b may be precisely disposed by first and second fiducial marks 115 and 125. Particularly, alignment between the plurality of semiconductor chips 120a and 120b as well as alignment of each of the plurality of semiconductor chips 120a and 120b may be possible. In this case, accuracy of the alignment may further be improved.

A description for other configurations and an additional description, for example, contents for the first and second fiducial marks 115 and 125 described above with reference to FIGS. 9 through 10B, and the like, may be applied to the fan-out semiconductor package 100D according to another exemplary embodiment, and a detailed description thereof overlaps that described above, and is thus omitted.

As set forth above, according to the exemplary embodiments in the present disclosure, a fan-out semiconductor package having improved reliability by having fiducial marks formed on a core member and a semiconductor chip may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
a core member having a through-hole and having first fiducial marks disposed on an upper surface thereof in the vicinity of the through-hole;
a semiconductor chip disposed in the through-hole and having an active surface, having connection pads and second fiducial marks disposed thereon, and an inactive surface opposing the active surface;
an encapsulant encapsulating at least portions of the semiconductor chip; and
a connection member disposed on the active surface of the semiconductor chip and including a redistribution layer electrically connected to the connection pads of the semiconductor chip,
wherein the first fiducial marks are disposed to be symmetrical to each other with respect to a center of the through-hole on a plane view of the fan-out semiconductor package perpendicular to a stacking direction, and the second fiducial marks are disposed to be symmetrical to each other with respect to a center of the semiconductor chip on the plane view.

2. The fan-out semiconductor package of claim 1, wherein the first and second fiducial marks are disposed on diagonal lines passing through the center of the semiconductor chip on the plane view.

3. The fan-out semiconductor package of claim 1, wherein the first fiducial marks are disposed on a level different from that of the second fiducial marks with respect to the staking direction.

4. The fan-out semiconductor package of claim 1, wherein the through-hole has a rectangular shape on the plane view, and
the first fiducial marks are disposed outside corners of the through-hole.

5. The fan-out semiconductor package of claim 1, wherein the through-hole has a rectangular shape on the plane view, and
at least two of the first fiducial marks are disposed side-by-side outside of sidewalls of the through-hole.

6. The fan-out semiconductor package of claim 1, wherein the semiconductor chip has a rectangular shape on the plane view, and
the second fiducial marks are disposed adjacent to vertices of the semiconductor chip.

7. The fan-out semiconductor package of claim 1, wherein each of the second fiducial marks has a cross shape on the plane view.

8. The fan-out semiconductor package of claim 1, wherein a center of each of the second fiducial marks is disposed within 150 µm from adjacent edges of the semiconductor chip.

9. The fan-out semiconductor package of claim 1, wherein a length of each of the second fiducial marks in one direction is in a range of 60 µm to 100 µm.

10. The fan-out semiconductor package of claim 1, wherein the first fiducial marks have a size greater than that of the second fiducial marks.

11. The fan-out semiconductor package of claim 1, wherein the core member includes a first core insulating layer, a first wiring layer disposed on one surface of the first core insulating layer and embedded in the first core insulating layer, and a second wiring layer disposed on another surface of the first core insulating layer opposing the one surface of the first core insulating layer,
the first wiring layer is in contact with the connection member, and
the first and second wiring layers are electrically connected to the connection pads.

12. The fan-out semiconductor package of claim 11, wherein the core member further includes a second core insulating layer, disposed on the first core insulating layer and covering the second wiring layer, and a third wiring layer disposed on the second core insulating layer, and
the third wiring layer is electrically connected to the connection pads.

13. The fan-out semiconductor package of claim 12, wherein the first and second wiring layers and the second and third wiring layers are electrically connected to each other through first and second vias, respectively, each penetrating through the first and second core insulating layers.

14. The fan-out semiconductor package of claim 1, wherein the core member includes a first core insulating layer and a first wiring layer and a second wiring layer disposed on opposite surfaces of the first core insulating layer, respectively, and
the first and second wiring layers are electrically connected to the connection pads.

15. The fan-out semiconductor package of claim 14, wherein the core member further includes a second core insulating layer, disposed on the first core insulating layer and covering the first wiring layer, and a third wiring layer disposed on the second core insulating layer, and
the third wiring layer is electrically connected to the connection pads.

16. The fan-out semiconductor package of claim 15, wherein the core member further includes a third core insulating layer, disposed on the first core insulating layer at an opposing side of the second core insulating layer and covering the second wiring layer, and a fourth wiring layer disposed on the third core insulating layer, and
the fourth wiring layer is electrically connected to the connection pads.

17. The fan-out semiconductor package of claim 16, wherein the first to fourth wiring layers are electrically connected to each other through first to third vias, respectively, each penetrating through the first to third core insulating layers.

18. A fan-out semiconductor package comprising:
a core member having a through-hole;
a semiconductor chip disposed in the through-hole and having an active surface having connection pads disposed thereon and an inactive surface opposing the active surface;
an encapsulant encapsulating at least portions of the semiconductor chip; and
a connection member disposed on the active surface of the semiconductor chip and including a redistribution layer electrically connected to the connection pads of the semiconductor chip,
wherein the core member has first fiducial marks disposed at a circumference of the through-hole, and the semiconductor chip has second fiducial marks disposed on the active surface.

19. The fan-out semiconductor package of claim 18, wherein a center of the second fiducial marks coincides with that of the semiconductor chip, on a plane view of the fan-out semiconductor package perpendicular to a stacking direction.

* * * * *